United States Patent
Im et al.

(10) Patent No.: US 10,607,971 B2
(45) Date of Patent: Mar. 31, 2020

(54) SEMICONDUCTOR PACKAGE

(71) Applicant: SAMSUNG ELECTRONICS CO., LTD., Suwon-si (KR)

(72) Inventors: Yun Hyeok Im, Hwaseong-si (KR); Hee Seok Lee, Suwon-si (KR); Tae Woo Kang, Suwon-si (KR); Yeong Seok Kim, Seongnam-si (KR); Kyoung-Min Lee, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 1 day.

(21) Appl. No.: 15/968,143

(22) Filed: May 1, 2018

(65) Prior Publication Data

US 2019/0115325 A1 Apr. 18, 2019

(30) Foreign Application Priority Data

Oct. 17, 2017 (KR) .......................... 10-2017-0134688

(51) Int. Cl.
*H01L 23/34* (2006.01)
*H01L 25/10* (2006.01)
(Continued)

(52) U.S. Cl.
CPC ........ *H01L 25/105* (2013.01); *H01L 23/3675* (2013.01); *H01L 23/3677* (2013.01);
(Continued)

(58) Field of Classification Search
CPC ............ H01L 25/105; H01L 23/49827; H01L 23/5389; H01L 23/3675; H01L 2924/181;
(Continued)

(56) References Cited

U.S. PATENT DOCUMENTS 8,039,939 B2 10/2011 Hwang
8,169,064 B2 5/2012 Kim
(Continued)

FOREIGN PATENT DOCUMENTS

KR 10-1653563 B1 9/2016

*Primary Examiner* — Cuong B Nguyen
*Assistant Examiner* — Samuel Park
(74) *Attorney, Agent, or Firm* — Sughrue Mion, PLLC

(57) ABSTRACT

The semiconductor package including a first semiconductor package including a first semiconductor package substrate, and a first semiconductor chip on the first semiconductor package substrate, an interposer disposed on the first semiconductor package is provided. Interposer electrically connects the first semiconductor package with an external semiconductor package, and has first and second sides opposed to each other. The second side is located between the first side and the first semiconductor package substrate, a first recess is formed in the second side of the interposer. The first recess has side walls extended from the second side toward the first side of the interposer and an upper surface connected to the side walls and the upper surface of the first recess faces the first semiconductor chip and a via in the interposer. The via does not transmit an electrical signal between the first semiconductor package and the external semiconductor package.

23 Claims, 18 Drawing Sheets

(51) Int. Cl.
*H01L 23/367* (2006.01)
*H01L 23/538* (2006.01)
*H01L 23/498* (2006.01)

(52) U.S. Cl.
CPC .. *H01L 23/49816* (2013.01); *H01L 23/49827* (2013.01); *H01L 23/5385* (2013.01); *H01L 23/5389* (2013.01); *H01L 2224/16225* (2013.01); *H01L 2224/32225* (2013.01); *H01L 2224/48091* (2013.01); *H01L 2224/48227* (2013.01); *H01L 2224/73265* (2013.01); *H01L 2225/1035* (2013.01); *H01L 2225/1058* (2013.01); *H01L 2225/1094* (2013.01); *H01L 2924/15311* (2013.01); *H01L 2924/181* (2013.01)

(58) Field of Classification Search
CPC . H01L 2224/16225; H01L 2224/32225; H01L 2224/48091; H01L 2924/15311; H01L 2224/73265; H01L 2225/1035; H01L 2225/1058; H01L 2225/1094; H01L 23/528; H01L 23/5384; H01L 23/49811; H01L 24/81; H01L 24/16; H01L 24/13; H01L 24/83; H01L 2924/15174; H01L 2924/19106; H01L 2924/19011; H01L 2224/92125; H01L 2225/06517; H01L 2924/15192; H01L 2924/10253; H01L 2224/2919; H01L 2224/48227; H01L 2224/81203; H01L 2224/16227; H01L 2924/1433; H01L 2924/1434; H01L 2225/06572; H01L 24/32; H01L 2224/13147; H01L 25/18; H01L 2224/73204; H01L 2224/131; H01L 25/16; H01L 2924/1461; H01L 2224/81815; H01L 24/92; H01L 24/73; H01L 23/48; H01L 25/065; H01L 2224/81207; H01L 2924/15184; H01L 2224/83851; H01L 2924/1421

See application file for complete search history.

(56) References Cited

U.S. PATENT DOCUMENTS

| | | | |
|---|---|---|---|
| 8,411,444 | B2 | 4/2013 | Gaynes et al. |
| 9,271,388 | B2 | 2/2016 | Hsu |
| 9,287,235 | B2 | 3/2016 | Sweere |
| 9,318,411 | B2 | 4/2016 | Lin et al. |
| 9,478,500 | B2 | 10/2016 | Chen et al. |
| 2009/0166834 | A1* | 7/2009 | Yoon .............. H01L 23/3128 257/686 |
| 2010/0148354 | A1* | 6/2010 | Choi .............. H01L 23/147 257/698 |
| 2013/0224891 | A1* | 8/2013 | Takizawa .......... H01L 22/10 438/15 |
| 2016/0027764 | A1* | 1/2016 | Kim .............. H01L 24/97 257/686 |

* cited by examiner

SEMICONDUCTOR PACKAGE

This application claims priority from Korean Patent Application No. 10-2017-0134688 filed on Oct. 17, 2017, in the Korean Intellectual Property Office, the disclosure of which is incorporated herein by reference in its entirety.

BACKGROUND

1. Field of the Disclosure

The present disclosure relates to a semiconductor package.

2. Description of the Related Art

As electronic devices become slimmer and slimmer, the thickness of semiconductor packages is ever decreasing. As the thickness of the semiconductor package decreases, a variety of approaches to effectively dissipate the heat generated from semiconductor chips are being developed.

SUMMARY

Aspects of the present disclosure provide a semiconductor package capable of transferring heat generated from a semiconductor chip in horizontal and vertical directions to reduce thermal resistance.

This and other aspects, embodiments and advantages of the present disclosure will become immediately apparent to those of ordinary skill in the art upon review of the Detailed Description and Claims to follow.

According to some embodiments of the present inventive concept, there is provided a semiconductor package including a first semiconductor package including a first semiconductor package substrate, and a first semiconductor chip on the first semiconductor package substrate, an interposer disposed on the first semiconductor package and wherein the interposer electrically connects the first semiconductor package with an external semiconductor package, and has first and second sides opposed to each other, wherein the second side is located between the first side and the first semiconductor package substrate, a first recess formed in the second side of the interposer, wherein the first recess has side walls extended from the second side toward the first side of the interposer and an upper surface connected to the side walls and the upper surface of the first recess faces the first semiconductor chip and a via in the interposer, extended from the second side toward the first side of the interposer and disposed between the upper surface of the first recess and the first side of the interposer, wherein the via does not transmit an electrical signal between the first semiconductor package and the external semiconductor package.

According to some embodiments of the present inventive concept, there is provided a semiconductor package including a first semiconductor package including a first semiconductor package substrate, and a first semiconductor chip on the first semiconductor package substrate, an interposer disposed on the first semiconductor package and wherein the interposer electrically connects the first semiconductor package with an external semiconductor package, and has first and second sides opposed to each other, wherein the second side is located between the first side and the first semiconductor package substrate, a first recess formed in the second side of the interposer, wherein the first recess has side walls extended from the second side toward the first side of the interposer, and an upper surface connected to the side walls and the upper surface of the first recess faces the first semiconductor chip, an interposer connecting element disposed on the second side of the interposer and exchanges an electrical signal with the first semiconductor package substrate, a first pad disposed on the first side of the interposer and electrically connects the interposer connecting element with the external semiconductor package and a via disposed in the interposer and extended from the second side toward the first side of the interposer, and disposed between the upper surface of the first recess and the first side of the interposer, wherein the via is electrically connected to neither the first pad nor the interposer connecting element.

According to some embodiments of the present inventive concept, there is provided a semiconductor package including a first semiconductor package including a first semiconductor package substrate, and a first semiconductor chip on the first semiconductor package substrate, a second semiconductor package including a second semiconductor package substrate, and a second semiconductor chip on the second semiconductor package substrate, an interposer interposed between the first semiconductor package and the second semiconductor package and electrically connects the first semiconductor package and the second semiconductor package, and wherein the interposer includes first and second sides opposed to each other and the second side is located between the first side and the first semiconductor package substrate, a first recess formed in the second side of the interposer, wherein the first recess includes side walls extended from the second side toward the first side of the interposer, and an upper surface connected to the side walls to face the first semiconductor chip and a via in the interposer and extended from the second side toward the first side of the interposer and disposed between the upper surface of the first recess and the first side of the interposer, wherein the via does not transmit an electrical signal between the first semiconductor package and the second semiconductor package.

In one embodiment, there is a semiconductor package including: a first semiconductor package including a first semiconductor package substrate and a first semiconductor chip disposed on the first semiconductor package substrate; an interposer disposed on the first semiconductor package, wherein the interposer electrically connects the first semiconductor package with another semiconductor package, the interposer including a first recess, a first side and a second side that is opposed to the first side, wherein the second side is located between the first side and the first semiconductor package substrate, the first recess is formed in the second side of the interposer, and the first recess has side walls extending from the second side toward the first side of the interposer and a recess upper surface connected to the side walls, and the recess upper surface is disposed to face the first semiconductor chip; and a via disposed in the interposer, extending from the second side toward the first side of the interposer and disposed between the recess upper surface and the first side of the interposer, wherein the via is not configured to transmit an electrical signal between the first semiconductor package and the another semiconductor package.

In another embodiment, there is a semiconductor package including: a first semiconductor package including a first semiconductor package substrate, and a first semiconductor chip disposed on the first semiconductor package substrate; an interposer disposed on the first semiconductor package, wherein the interposer electrically connects the first semiconductor package with an another semiconductor package, the interposer including a first recess, a first side and a second side opposed to the first side, wherein the second side is located between the first side and the first semiconductor package substrate and the first recess is formed in the second side of the interposer, and the first recess has side walls extending from the second side toward the first side of the interposer, and a recess upper surface connected to the side walls, and the recess upper surface is disposed to face the first semiconductor chip; an interposer connecting element disposed on the second side of the interposer and configured to transmit electrical signals between the interposer and the first semiconductor package substrate; a first pad disposed on the first side of the interposer and electrically connects the interposer connecting element with the another semiconductor package; and a via disposed in the interposer and extending from the second side toward the first side of the interposer, and disposed between the recess upper surface and the first side of the interposer, wherein the via is not configured to transmit electrical signals between the first pad and the interposer connecting element.

In one embodiment, there is a semiconductor package including: a first semiconductor package including a first semiconductor package substrate, and a first semiconductor chip disposed on the first semiconductor package substrate; a second semiconductor package including a second semiconductor package substrate, and a second semiconductor chip disposed on the second semiconductor package substrate; an interposer interposed between the first semiconductor package and the second semiconductor package and electrically connects the first semiconductor package and the second semiconductor package, wherein the interposer includes a first side and a second side opposed to the first side, and wherein the second side is located between the first side and the first semiconductor package substrate; a first recess formed in the second side of the interposer, wherein the first recess includes side walls extending from the second side toward the first side of the interposer, and a recess upper surface connected to the side walls to face the first semiconductor chip; and a via disposed in the interposer and extending from the second side toward the first side of the interposer and disposed between the recess upper surface and the first side of the interposer, wherein the via is not configured to transmit electrical signals between the first semiconductor package and the second semiconductor package.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION OF THE EMBODIMENTS

Hereinafter, a semiconductor package according to some exemplary embodiments of the present disclosure will be described with reference to FIGS. 1 and 2.

Figure 1:
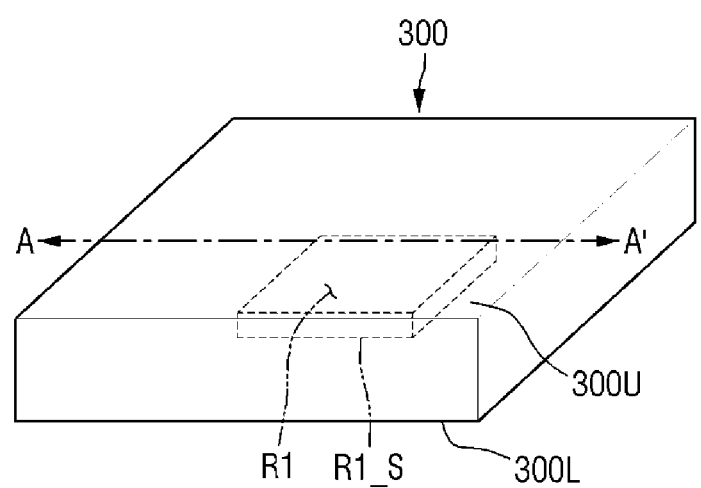
FIG. 1 is a plan view for illustrating an interposer according to some exemplary embodiments of the present disclosure.

FIG. 1 is a plan view for illustrating an interposer 300 according to some exemplary embodiments of the present disclosure. FIG. 2 is a cross-sectional view for illustrating a semiconductor package according to some exemplary embodiments of the present disclosure. The cross-sectional view of the interposer 300 shown in FIG. 2 may be taken along line A-A' of FIG. 1.

Figure 2:
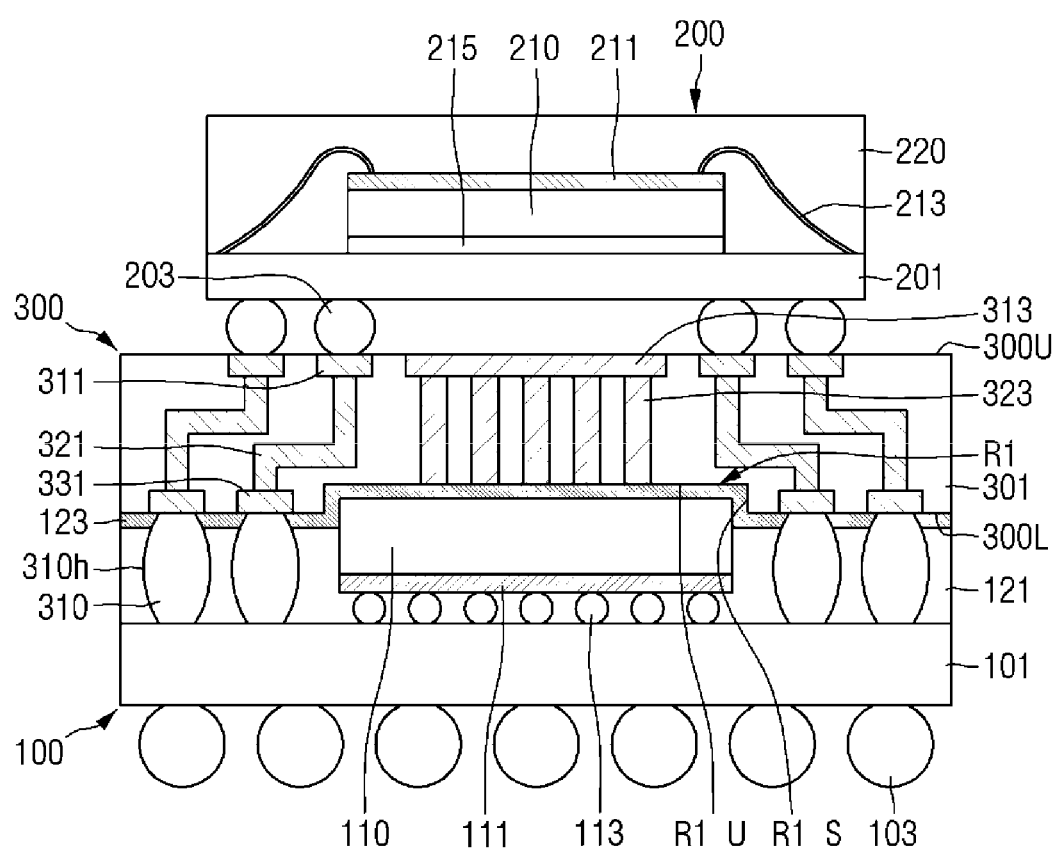
FIGS. 2 to 13 are views for illustrating semiconductor packages according to some exemplary embodiments of the present disclosure.

Referring to FIGS. 1 and 2, a semiconductor package according to some exemplary embodiments of the present disclosure may include a first semiconductor package 100, a second semiconductor package 200 and an interposer 300.

The first semiconductor package 100 may include a first semiconductor package substrate 101, a first semiconductor chip 110, a first molding material 121, and a first adhesive layer 123.

The first semiconductor package substrate 101 may be for packaging and may include, for example, a printed circuit board (PCB) or a ceramic substrate. The first semiconductor package substrate 101 may include an upper surface and a lower surface that are opposed to each other, i.e., are on opposite sides of the first semiconductor package substrate 101. The first semiconductor chip 110 may be mounted on the upper surface of the first semiconductor package substrate 101. External connecting terminals 103, e.g., package connecting terminal, may be disposed on the lower surface of the first semiconductor package substrate 101. The number of the external connecting terminals 103 is not limited to that shown in the drawings. For example, any number of the external connecting terminals 103 may be disposed on the lower surface of the first semiconductor package substrate 101 as desired.

The external connecting terminals 103 may be, but are not limited to, conductive balls or solder balls. The external connecting terminals 103 may be, for example, any of conductive bumps, conductive spacers, and a pin grid array (PGA). The first semiconductor package 100 may be electrically connected, e.g., may be configured to be electrically connected, to an external device via the external connecting terminals 103.

The first semiconductor chip 110 may be, for example, in the form of a flip chip. The lower surface of the first semiconductor chip 110 may be a first semiconductor element circuit region 111. The first semiconductor chip 110 may be a single semiconductor chip. Alternatively, the first semiconductor chip 110 may be, for example, a stack of a plurality of semiconductor chips.

First connecting elements 113 may be disposed in the first semiconductor element circuit region 111. The first connecting elements 113 may be, for example, solder balls or conductive bumps.

The first semiconductor chip 110 may be electrically connected to the first semiconductor package substrate 101 via the first connecting elements 113. The number of the first connecting elements 113 is not limited to that shown in the drawings. It is to be understood that any number of the first connecting elements 113 may be disposed as desired.

The first molding material 121 may include a portion of holes 310h that receives interposer connecting elements 310. The space between the first semiconductor chip 110 and the first semiconductor package substrate 101 may be completely filled with the first molding material 121. The first molding material 121 may surround a part of the side surfaces of the first semiconductor chip 110 and a part of the interposer connecting elements 310.

The first molding material 121 may be, for example, an epoxy molding compound (EMC).

The space between the first molding material 121 and the interposer 300, which is not covered by the first molding material 121, may be filled with the first adhesive layer 123. The space between the first semiconductor chip 110 and the interposer 300 may be completely filled with the first adhesive layer 123. The first adhesive layer 123 may surround the remaining part of the side surfaces of the first semiconductor chip 110 that is not covered by the first molding material 121, and the remaining part of the interposer connecting elements 310 that is not covered by the first molding material 121. In an exemplary embodiment the interposer connecting elements 310 may be a single connecting element.

Although the first adhesive layer 123 is shown in the drawings, it is not an essential element of the present disclosure. For example, the first adhesive layer 123 may be eliminated if necessary.

The second semiconductor package 200 may be disposed on the first semiconductor package 100. The first semiconductor package 100 and the second semiconductor package 200 may form a package-on-package (PoP) structure, for example. The second semiconductor package 200 may include a second semiconductor package substrate 201, a second semiconductor chip 210, and a second molding material 220.

The second semiconductor package substrate 201 may be of the same type as or a different type from the first semiconductor package substrate 101. The second semiconductor package substrate 201 may include a first surface and a second surface and they may be opposed to each other, i.e., on opposite sides of the second semiconductor package substrate 201. The second semiconductor chip 210 may be mounted on the first surface of the second semiconductor package substrate 201. Second connecting elements 203, including, e.g., a first connecting element and a second connecting element, may be disposed on the second surface of the second semiconductor package substrate 201. The second semiconductor package 200 may be electrically connected to an external device or another semiconductor package or the like via the second connecting elements 203. The second connecting elements 203 may be of the same type as the external connecting terminals 103, for example. However, the technical idea of the present disclosure is not limited thereto. For example, the second connecting elements 203 may be of a different type from the external connecting terminals 103 as long as they can electrically connect the second semiconductor package 200 to an external device or another semiconductor package, etc.

The second connecting elements 203 may be disposed so that they do not overlap with, for example, a second pad 313, in the vertical direction as shown in the drawings. However, the technical idea of the present disclosure is not limited thereto. The second connecting elements 203 may overlap with at least a part of the second pad 313, for example. Even if the second connecting elements 203 overlap with the second pad 313, they may not be electrically connected to the second pad 313.

The second semiconductor chip 210 may be attached to the second semiconductor package substrate 201 by a second adhesive 215. The second semiconductor chip 210 may be electrically connected to the second semiconductor package substrate 201 via third connecting elements 213. The upper surface of the second semiconductor chip 210 may be a second semiconductor element circuit region 211. The third connecting elements 213 may be wire bondings, for example. Although the second semiconductor chip 210 is shown as a single semiconductor chip in the drawings, this is merely illustrative. For example, the second semiconductor chip 210 may be a stack of a plurality of semiconductor chips.

The first semiconductor chip 110 and the second semiconductor chip 210 may be, for example, memory chips, logic chips, or the like. When the first semiconductor chip 110 and/or the second semiconductor chip 210 are logic chips, the first semiconductor chip 110 and/or the second semiconductor chip 210 may be variously designed taking into account the operations to be performed. When the first semiconductor chip 110 and/or the second semiconductor chip 210 are memory chips, the memory chips may be non-volatile memory chips, for example.

The second molding material 220 may be formed on the second semiconductor package substrate 201. The second molding material 220 may seal the upper surface of the second semiconductor package substrate 201, the second semiconductor chip 210 and the third connecting elements 213. The second molding material 220 may include the same material as the first molding material 121, for example.

The interposer 300 may be disposed on the first semiconductor package 100. The interposer 300 may be interposed between the first semiconductor package 100 and the second semiconductor package 200. The interposer connecting elements 310 may be inserted into, e.g., disposed in, the holes 310h of the first molding material 121, respectively.

The interposer 300 may be electrically connected to the first semiconductor package substrate 101 via the interposer connecting elements 310 to transmit/receive electrical signals to/from the first semiconductor package 100.

The interposer 300 may electrically connect the first semiconductor package 100 to an external semiconductor package, e.g., another semiconductor package. For example, the interposer 300 may electrically connect the first semiconductor package 100 with the second semiconductor package 200.

The interposer 300 may include a first side 300U and a second side 300L opposed to each other, i.e., on opposite sides of the interposer 300. The second side 300L of the interposer 300 may be located between the first side 300U of the interposer 300 and the first semiconductor package substrate 101.

Elements for connecting to an external semiconductor package may be disposed on the first side 300U of the interposer 300. For example, on the first side 300U of the interposer 300, the second connecting elements 203 may be disposed. The second connecting elements 203 may be interposed between the first side 300U of the interposer 300 and the second semiconductor package substrate 201.

First pads 311 and the second pad 313 may be disposed on the first side 300U of the interposer 300. A plurality of first pads 311 may be disposed on the first side 300U of the interposer 300, for example. Although the upper surface of the first pads 311 and the first side 300U of the interposer 300 are shown as being on the same plane in the drawings, the technical idea of the present disclosure is not limited thereto. For example, at least a portion of the first pads 311 may protrude, e.g., may be protruding, from the first side 300U of the interposer 300.

The first pads 311 may be electrically connected to elements for connecting to an external semiconductor package disposed on the interposer 300. That is, the first pads 311 may be electrically connected to an external semiconductor package. Accordingly, the first pads 311 may allow electrical signals to be exchanged between the external semiconductor package and the first semiconductor package 100. For example, the first pads 311 may allow the second semiconductor package 200 and the first semiconductor package 100 to transmit/receive electrical signals therebetween. The first pads 311 may electrically connect the interposer connecting elements 310 to an external semiconductor package (e.g., the second semiconductor package 200). The first pads 311 may include a conductive material, for example.

The second pad 313 may be spaced apart from the first pads 311 and disposed on the first side 300U of the interposer 300. Although the second pad 313 is shown as a continuous, single piece in the drawings, this is merely illustrative. It is to be understood that, in other implementations, a plurality of separated second pads, whose number is equal to that of the second vias 323, may be disposed on the first side 300U of the interposer 300. In addition, although the upper surface of the second pad 313 and the first side 300U of the interposer 300 are shown as being on the same plane in the drawings, the technical idea of the present disclosure is not limited thereto. For example, at least a portion of the second pads may protrude from the first side 300U of the interposer 300.

The second pad 313 may not transfer or transmit electrical signals between an external semiconductor package (e.g., the second semiconductor package 200) disposed on the interposer 300 and the first semiconductor package 100.

The second pad 313 may include, for example, a material capable of transferring the heat of the first semiconductor package 100 to the outside (e.g., a heat transfer material).

On the second side 300L of the interposer 300, the interposer connecting elements 310 may be attached. Third pads 331, including e.g., a third pad, may be disposed on the second side 300L of the interposer 300. A plurality of third pads 331 may be disposed on the second side 300L of the interposer 300, for example. Although the lower surface of the third pads 331 and the second side 300L of the interposer 300 are shown as being on the same plane in the drawings, the technical idea of the present disclosure is not limited thereto. For example, at least a portion of the third pads 331 may protrude from the second side 300L of the interposer 300.

The third pads 331 may be electrically connected to the interposer connecting elements 310. Accordingly, the third pads 331 may allow electrical signals to be exchanged between the interposer 300 and the first semiconductor package 100. The third pads 331 may include a conductive material, for example.

The first pads 311 and the third pads 331 may be connected to each other by, for example, first vias 321. The first vias 321 may be formed in the interposer 300 to penetrate at least a portion of the interposer 300.

The first vias 321 may allow an external semiconductor package and the first semiconductor package 100 to transmit/receive electrical signals between the first pads 311 and the third pads 331. For example, the first semiconductor package 100 and the second semiconductor package 200 may transmit electrical signals therebetween via the interposer connecting elements 310 electrically connected to the first semiconductor package substrate 101, the third pads 331, the first vias 321 and the first pads 311, and via the second connecting elements 203 electrically connected to the second semiconductor package substrate 201.

The second vias 323 may be formed in the interposer 300. At least some of the second vias 323 may be extended, i.e., extending, toward the first side 300U from the second side 300L of the interposer 300. The second vias 323 may be connected to the second pad 313, for example. The second vias 323 may be disposed between an upper surface R1_U of a first recess R1, e.g., recess upper surface, and the first side 300U of the interposer 300.

The second vias 323 may not transfer electrical signals between an external semiconductor package (e.g., the second semiconductor package 200) and the first semiconductor package 100. The second vias 323 may not be electrically connected to the first pads 311, the third pads 331 and the interposer connecting elements 310. The second vias 323 may include, for example, a material capable of transferring the heat of the first semiconductor package 100 to the outside (e.g., a heat transfer material).

The space between the first side 300U and the second side 300L of the interposer 300, which remains after forming the first pads 311, the second pad 313, the third pads 331, the first vias 321 and the second vias 323, may be filled with an interposer insulating layer 301.

The first recess R1 may be formed in the second side 300L of the interposer 300. The first recess R1 may have sidewalls R1_S extending from the second side 300L to the first side 300U of the interposer 300, and an upper surface R1_U connected to the sidewalls R1_S of the first recess R1 and facing the first semiconductor chip 110. The first recess R1 may not penetrate through the interposer 300. In some exemplary embodiment of the present disclosure, a portion of the interposer insulating layer 301 and a portion of the second via 323 may be exposed through the first recess R1, e.g., the first recess R1 exposes a portion of the interposer insulating layer 301 and a portion of the second via 323.

In some embodiments of the present disclosure, a portion of the first semiconductor chip 110 may be inserted into the first recess R1.

In the semiconductor package according to some exemplary embodiments of the present disclosure, a portion of the first semiconductor chip 110 may be inserted into the first recess R1 so that the overall thickness of the first semiconductor chip 110 can be increased. By increasing the overall thickness of the first semiconductor chip 110, it is possible to transfer the heat generated from the first semiconductor chip 110 in the horizontal direction. By transferring the heat in the horizontal direction, the thermal resistance is reduced, so that the performance of the semiconductor package can be improved. Further, by transferring the heat in the horizontal direction, the temperature distribution inside the semiconductor chip becomes even, so that the reliability of the semiconductor package can be improved.

In the semiconductor package according to some exemplary embodiments of the present disclosure, a portion of the first semiconductor chip 110 is inserted into the first recess R1 and the second vias 323 are formed on the upper surface R1_U, of the first recess R1, so that the heat generated from the first semiconductor chip 110 can be transferred in the vertical direction. The second vias 323 can transfer the heat generated from the first semiconductor chip 110 partially inserted into the first recess R1 in the vertical direction. By transferring the heat in the vertical direction, the thermal resistance is reduced, so that the performance of the semiconductor package can be improved.

Hereinafter, a semiconductor pack according to some exemplary embodiments of the present disclosure will be described with reference to FIG. 3. For clarity of illustration, the redundant description will be omitted.

Figure 3:
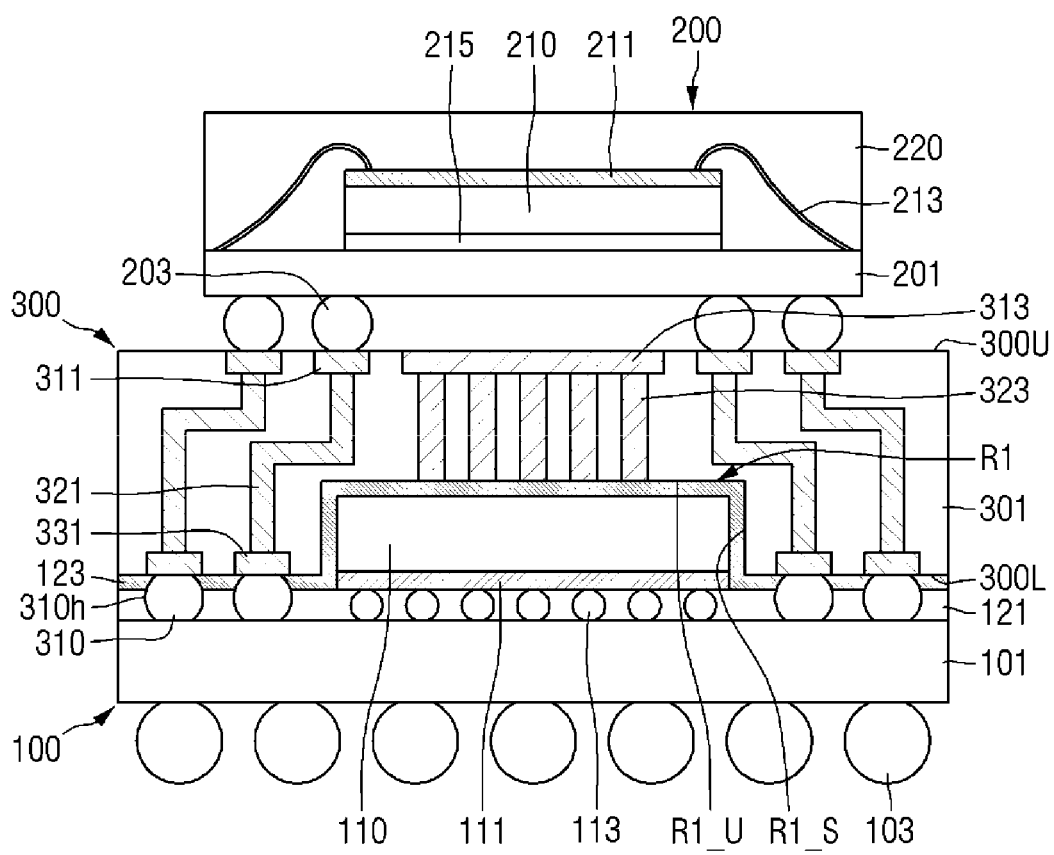

FIG. 3 is a cross-sectional view for illustrating a semiconductor package according to some exemplary embodiments of the present disclosure.

Referring to FIG. 3, the sidewalls R1_S of the first recess R1 of the semiconductor package according to some exemplary embodiments of the present disclosure may surround the entire sidewalls of the first semiconductor chip 110. In other words, the first semiconductor chip 110 may be completely inserted into the first recess R1.

The first adhesive layer 123 may be disposed along the sidewalls and the upper surface of the first semiconductor chip 110, e.g., first semiconductor chip upper surface. The first adhesive layer 123 may be disposed between the upper surface R1_U of the first recess R1 and the upper surface of the first semiconductor chip 110 and between the sidewalls R1_S of the first recess R1 and the respective sidewalls of the first semiconductor chip 110.

As the first semiconductor chip 110 is completely inserted into the first recess R1, the overall thickness of the interposer 300 can be increased. The thickness of the interposer 300 may be obtained by measuring the distance from the first side 300U to the second side 300L of the interposer 300, for example. Even if the thickness of the interposer 300 is increased, the overall height of the first semiconductor package 100 and the interposer 300 may not be increased compared to that of FIG. 1 because the first semiconductor chip 110 is completely inserted into the first recess R1. The overall height of the first semiconductor package 100 and the interposer 300 may refer to the height from the lower surface of the first semiconductor package substrate 101 to the first side 300U of the interposer 300, for example.

Even if the thickness of the interposer 300 is increased, the height of the interposer connecting elements 310 can be reduced because the overall height of the first semiconductor package 100 and the interposer 300 is not increased compared to that of FIG. 1. The height of the interposer connecting elements 310 may be obtained by measuring the distance from the upper surface of the first semiconductor package substrate 101 to the lower surface of the third pads 331, for example.

Hereinafter, a semiconductor package according to some exemplary embodiments of the present disclosure will be described with reference to FIG. 4. For clarity of illustration, the redundant description will be omitted.

Figure 4:
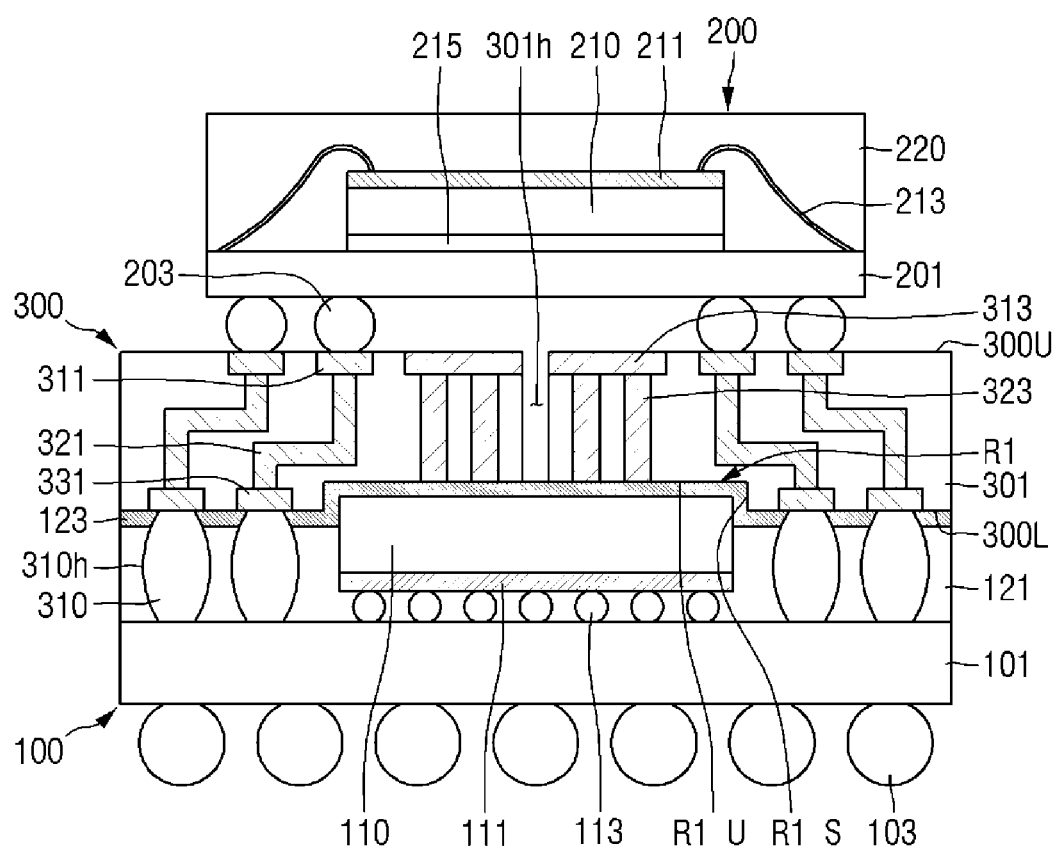

FIG. 4 is a cross-sectional view for illustrating a semiconductor package according to some exemplary embodiments of the present disclosure.

Referring to FIG. 4, the interposer 300 according to some exemplary embodiments of the present disclosure may include an interposer hole 301h penetrating from the upper surface R1_U of the first recess R1 to first side 300U of the interposer 300. The interposer hole 301h may be formed so that it overlaps with the first semiconductor chip 110. The interposer hole 301h may penetrate the second pad 313. The interposer hole 301h may be formed adjacent to the second vias 323.

Since the interposer hole 301h overlaps with the first semiconductor chip 110, the efficiency of transferring the heat generated in the first semiconductor chip 110 can be improved.

Hereinafter, a semiconductor package according to some exemplary embodiments of the present disclosure will be described with reference to FIG. 5. For clarity of illustration, the redundant description will be omitted.

Figure 5:
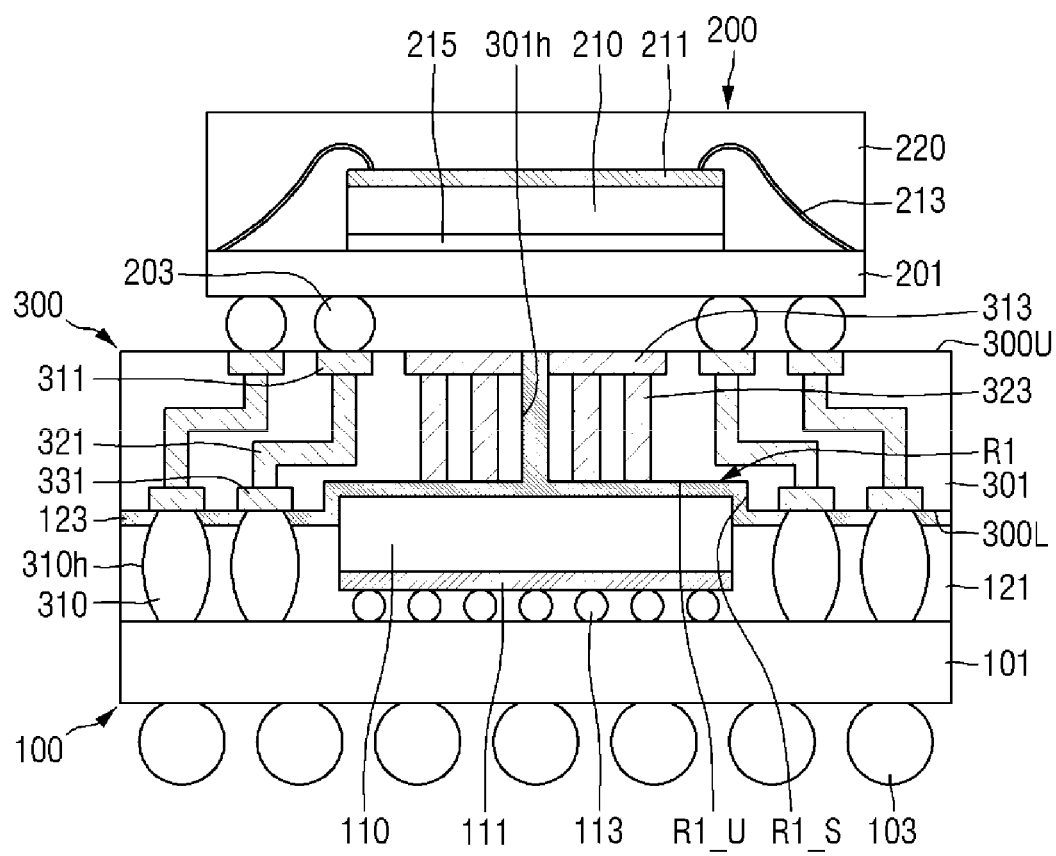

FIG. 5 is a cross-sectional view for illustrating a semiconductor package according to some exemplary embodiments of the present disclosure.

Referring to FIG. 5, in the semiconductor package according to some exemplary embodiments of the present disclosure, the interposer hole 301h may be at least partially filled with the first adhesive layer 123.

Although the interposer hole 301h is completely filled with the first adhesive layer 123 in the drawings, the technical idea of the present disclosure is not limited thereto. For example, it is understood that only a part of the interposer hole 301h may be filled with the first adhesive layer 123.

Hereinafter, a semiconductor pack according to some exemplary embodiments of the present disclosure will be described with reference to FIG. 6. For clarity of illustration, the redundant description will be omitted.

Figure 6:
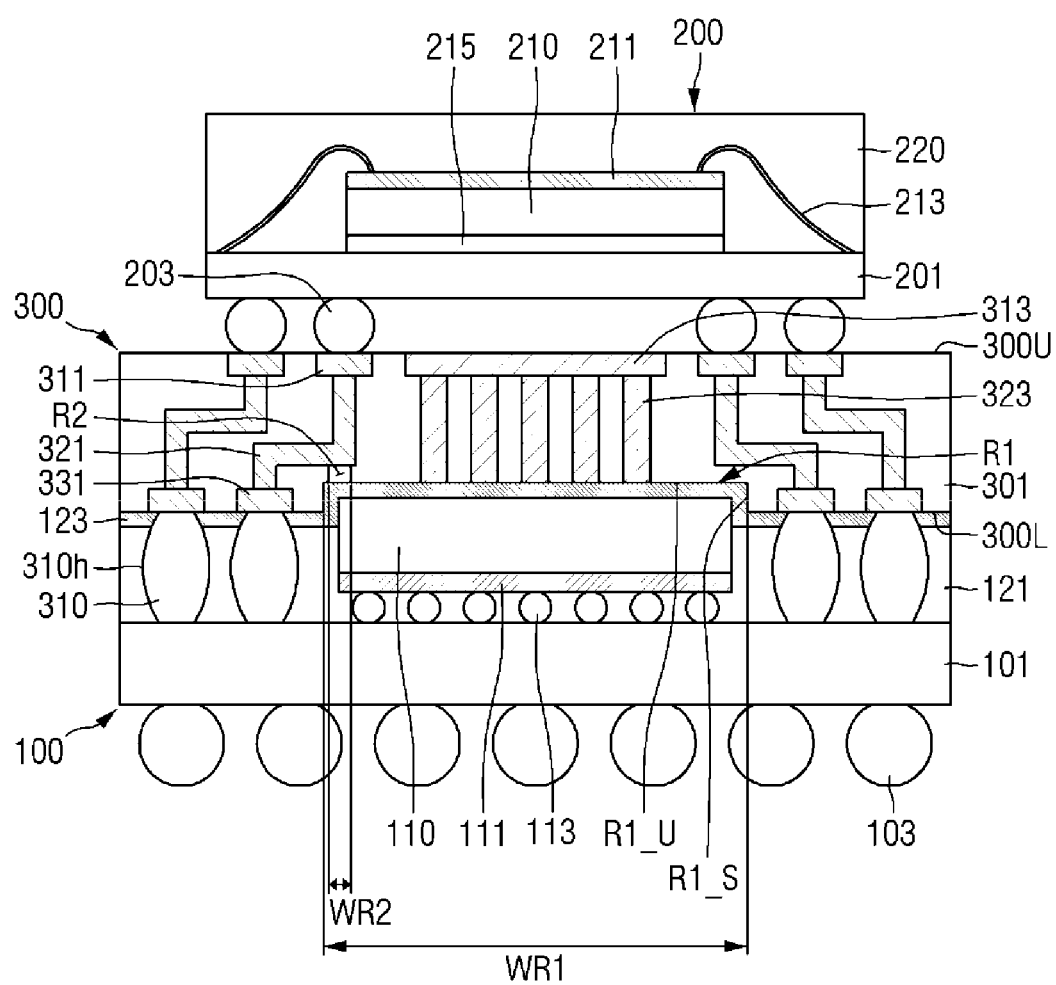

FIG. 6 is a cross-sectional view for illustrating a semiconductor package according to some exemplary embodiments of the present disclosure.

Referring to FIG. 6, an interposer 300 according to some exemplary embodiments of the present disclosure may include a second recess R2, e.g., a second recess, formed therein.

The second recess R2 may be formed on the upper surface R1_U of the first recess R1, for example. The width WR2 of the second recess R2, e.g., second recess width, may be smaller than the width WR1 of the first recess R1, e.g., first recess width. The width WR1 of the first recess R1 may be obtained by measuring the distance between the opposing ones of the side walls R1_S of the first recess R1. In addition, the width WR1 of the first recess R1 may be measured in the direction parallel to the upper surface of the first semiconductor package substrate 101 in the cross section of the first recess R1. The width WR2 of the second recess R2 may be obtained by measuring the distance between the opposing sidewalls of the second recess R2. In addition, the width WR2 of the second recess R2 may be measured in the direction parallel to the upper surface of the first semiconductor package substrate 101 in the cross section of the first recess R2.

In some exemplary embodiment of the present disclosure, the inside of the second recess R2 may be left as an empty space.

Alternatively, in some embodiments, at least a part of the inside of the second recess R2 may be filled with the first adhesive layer 123.

Although a portion of the first via 321 is exposed through the second recess R2 in the drawing, the technical idea of the present disclosure is not limited thereto. The second recess R2 may be, for example, formed in the upper surface R1_U of the first recess R1 and in the interposer insulating layer 301 so that a portion of the first via 321 is not exposed.

As the semiconductor package according to some exemplary embodiments of the present disclosure includes the second recess R2 so that a void that may be formed in the first adhesive layer 123 can be removed.

Hereinafter, a semiconductor pack according to some exemplary embodiments of the present disclosure will be described with reference to FIG. 7. For clarity of illustration, the redundant description will be omitted.

Figure 7:
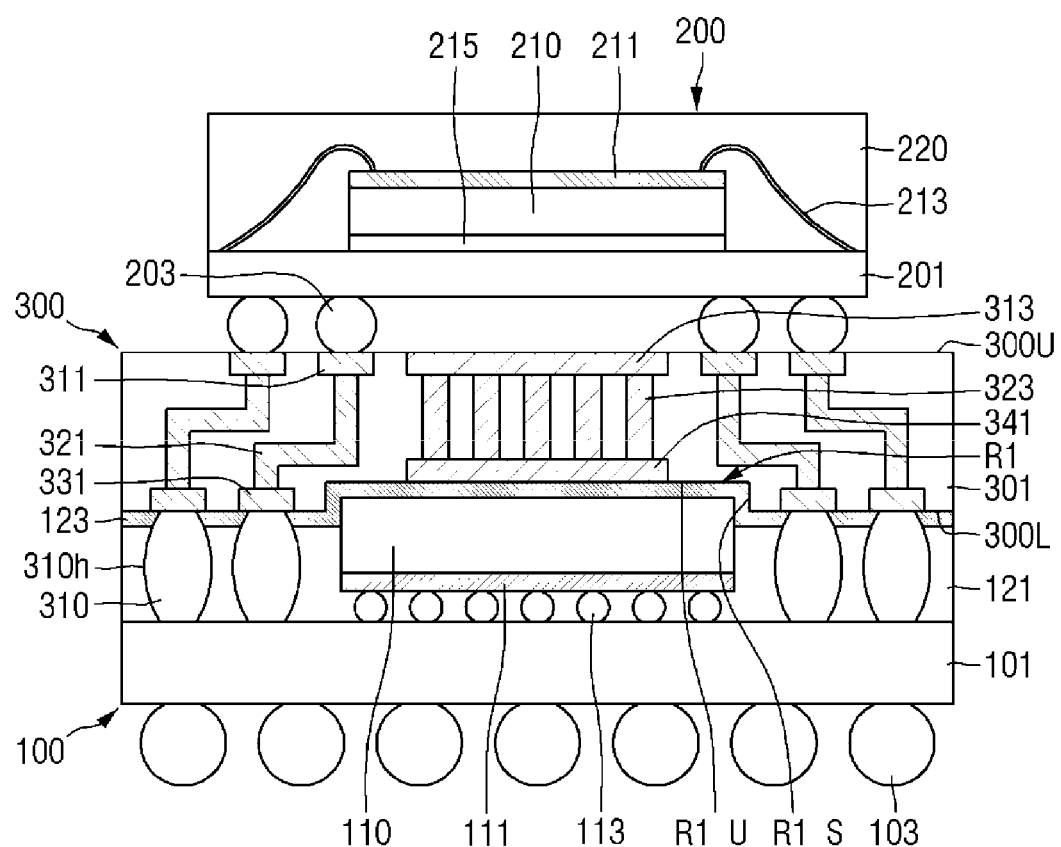

FIG. 7 is a cross-sectional view for illustrating a semiconductor package according to some exemplary embodiments of the present disclosure.

Referring to FIG. 7, the semiconductor package according to some exemplary embodiments of the present disclosure may further include a fourth pad 341.

The fourth pad 341 may be disposed on the upper surface R1_U of the first recess R1. In some embodiments, the fourth pad 341 may be exposed through the first recess R1. The fourth pad 341 may be spaced apart from the second pad 313. The fourth pad 341 may be connected to the second pad 313 by the second vias 323.

Although the fourth pad 341 is shown a continuous, signal piece in the drawing, this is merely illustrative. It is to be understood that, in other implementations, a plurality of separated fourth pads, whose number is equal to that of the second vias 323, may be disposed on the upper surface R1_U of the recess R1.

The first recess R1 of the semiconductor package according to some exemplary embodiments of the present disclosure may expose the fourth pad 341. For example, a portion of the interposer insulating layer 301 may be disposed between the fourth pad 341 and the second side 300L of the interposer 300 before the first recess R1 is formed. In other words, a portion of the interposer insulating layer 301 may be disposed on the lower surface of the fourth pad 341. To expose the fourth pad 341 through the first recess R1, a portion of the interposer insulating layer 301 may be removed. By removing a portion of the interposer insulating layer 301, the efficiency of transferring the heat generated from the first semiconductor chip 110 in the vertical direction can be improved.

Hereinafter, a semiconductor pack according to some exemplary embodiments of the present disclosure will be described with reference to FIG. 8. For clarity of illustration, the redundant description will be omitted.

Figure 8:
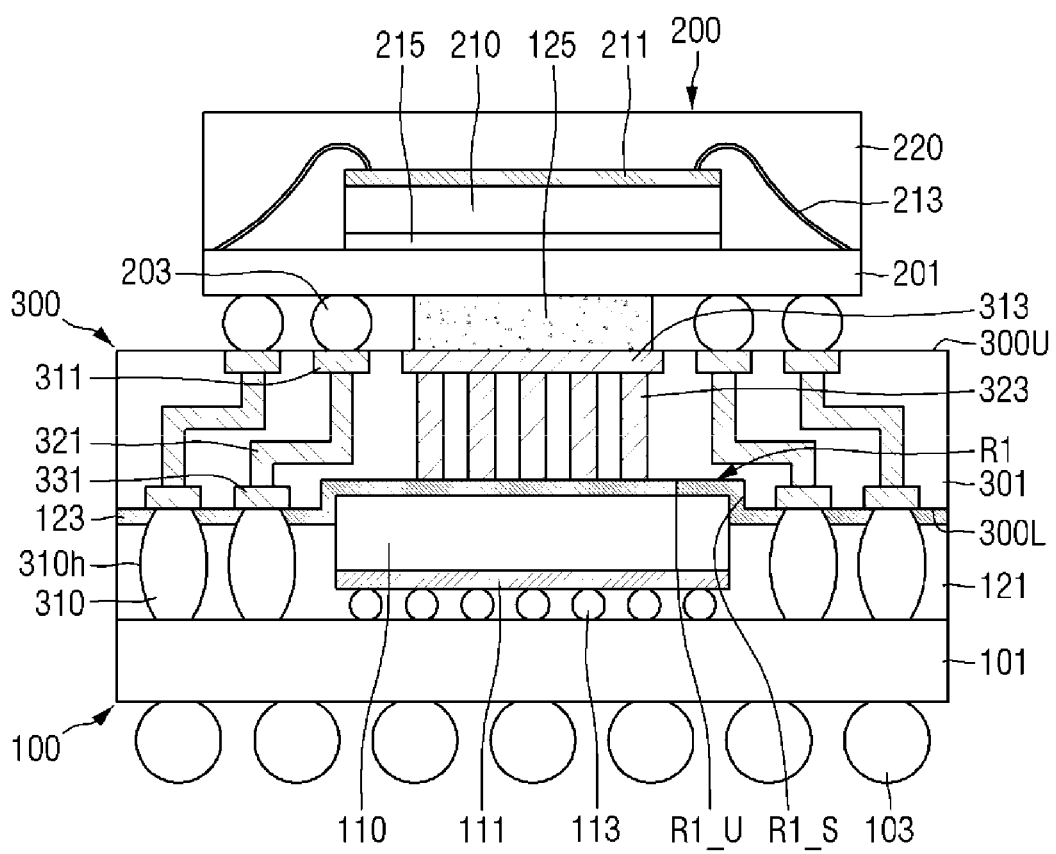

FIG. 8 is a cross-sectional view for illustrating a semiconductor package according to some exemplary embodiments of the present disclosure.

Referring to FIG. 8, the semiconductor package according to some exemplary embodiments of the present disclosure may further include a first thermal interface material layer (TIM layer) 125.

The first TIM layer 125 may be disposed on the first side 300U of the interposer 300. The first TIM layer 125 may be connected to a semiconductor package substrate of an external semiconductor package (e.g., the second semiconductor package substrate 201).

The first TIM layer 125 may be disposed, for example, to overlap with the second pad 313. The first TIM layer 125 may be disposed, for example, to overlap with the second vias 323.

The first TIM layer 125 may be disposed, for example, between elements for connecting to an external semiconductor package. For example, the first TIM layer 125 may be disposed between the second connecting elements 203, which are the elements for connecting to the second semiconductor package 200 and include a connecting element. The first TIM layer 125 may be interposed between an external semiconductor package and the interposer 300. For example, the first TIM layer 125 may be interposed between the second semiconductor package 200 and the interposer 300.

The first semiconductor chip 110 may be thermally connected to an external semiconductor package (for example, the second semiconductor package 200) through the second vias 323, the second pad 313 and the first TIM layer 125.

Hereinafter, a semiconductor package according to some exemplary embodiments of the present disclosure will be described with reference to FIG. 9. For clarity of illustration, the redundant description will be omitted.

Figure 9:
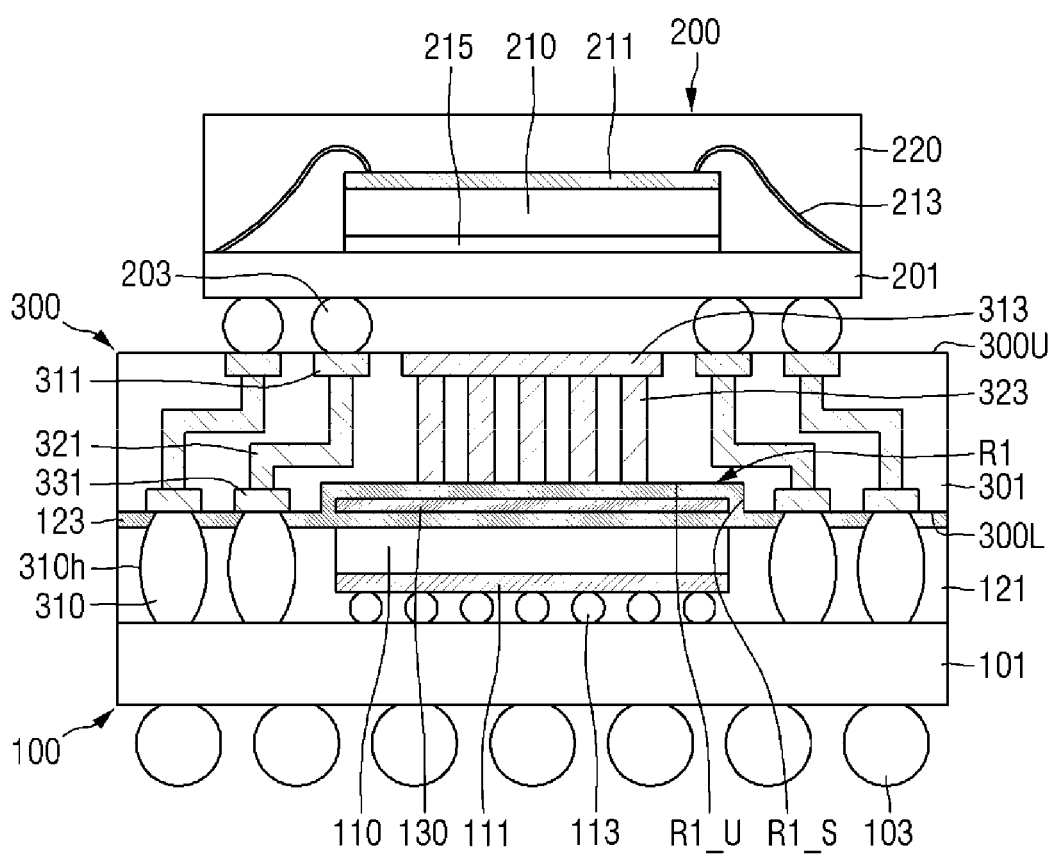

FIG. 9 is a cross-sectional view for illustrating a semiconductor package according to some exemplary embodiments of the present disclosure.

Referring to FIG. 9, the semiconductor package according to some exemplary embodiments of the present disclosure may include a conductive material layer 130 disposed in the first recess R1.

The conductive material layer 130 may be disposed between the upper surface of the first semiconductor chip 110 and the upper surface R1_U of the first recess R1. The conductive material layer 130 may be disposed, for example, spaced apart from the first semiconductor chip 110 in the first recess R1.

In some embodiments, the conductive material layer 130 may be surrounded by the first adhesive layer 123. For example, the first adhesive layer 123 may be formed between the upper surface of the first semiconductor chip 110 and the conductive material layer 130, between the conductive material layer 130 and the upper surface R1_U of the first recess R1, and between the side walls of the conductive material layer 130 and the respective side walls R1_S of the first recess R1.

Although the first semiconductor chip 110 is shown as not being disposed in the first recess R1 in the drawings, this is merely illustrative. For example, at least a portion of the first semiconductor chip 110 and the conductive material layer 130 may be disposed in the first recess R1.

Although the first semiconductor chip 110 and the conductive material layer 130 are shown as being spaced apart from each other in the drawing, this is merely illustrative. For example, the conductive material layer 130 may be disposed in contact with the upper surface of the first semiconductor chip 110. For another example, the conductive material layer 130 may be disposed in contact with the upper surface R1_U of the first recess R1 and may be in contact with the interposer 300. For another example, the conductive material layer 130 may be disposed in contact with the upper surface R1_U of the first recess R1 to be contact with the interposer 300, as well as the upper surface of the first semiconductor chip 110.

In the semiconductor package according to some exemplary embodiments of the present disclosure, even if the conductive material layer 130 having a higher thermal conductivity than that of the first semiconductor chip 110 is disposed on the first semiconductor chip 110, the efficiency of transferring the heat in the horizontal and vertical directions can be improved by virtue of the second vias 323.

Hereinafter, a semiconductor pack according to some exemplary embodiments of the present disclosure will be described with reference to FIG. 10. For clarity of illustration, the redundant description will be omitted.

Figure 10:
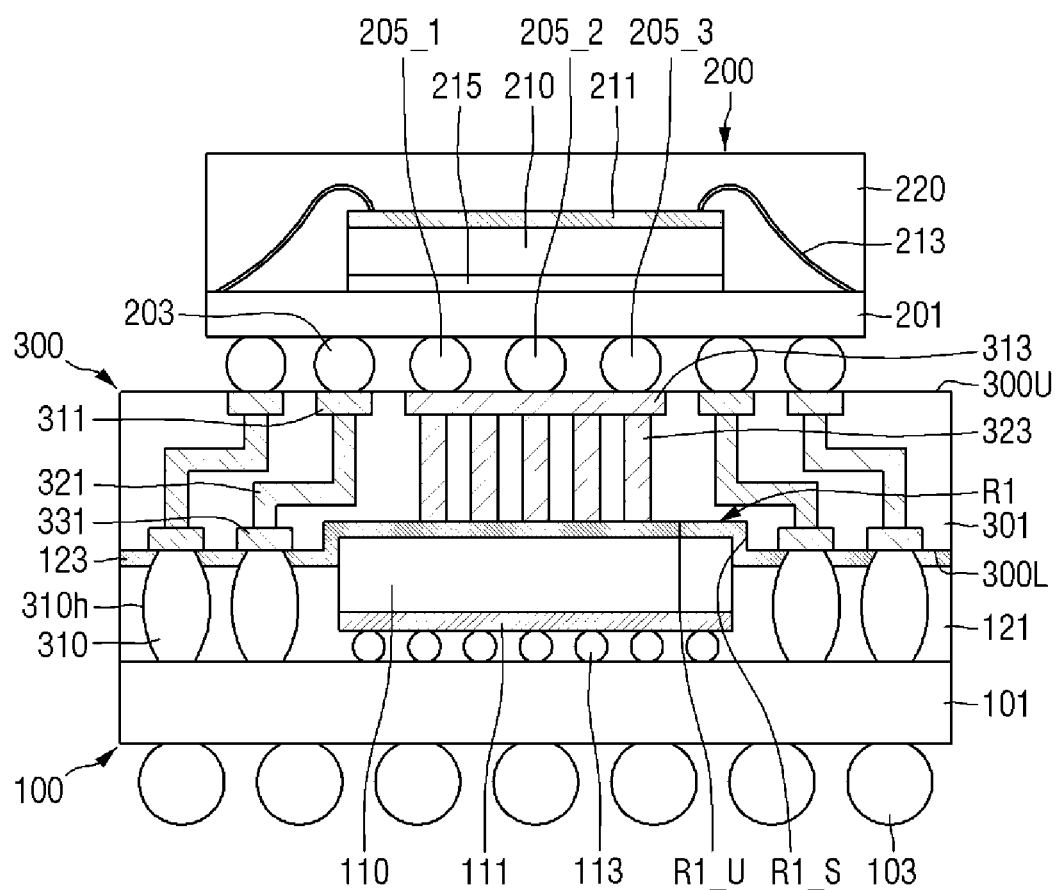

FIG. 10 is a cross-sectional view for illustrating a semiconductor package according to some exemplary embodiments of the present disclosure.

Referring to FIG. 10, the semiconductor package according to some exemplary embodiments of the present disclosure may further include fourth connecting elements 205_1, 205_2 and 205_3.

The fourth connecting elements 205_1, 205_2 and 205_3 may be disposed on the first side 300U of the interposer 300. The fourth connecting elements 205_1, 205_2 and 205_3 may be disposed on the second pad 313, for example. The fourth connecting elements 205_1, 205_2 and 205_3 may be disposed to overlap with the second vias 323. The fourth connecting elements 205_1, 205_2 and 205_3 may be connected to, for example, a semiconductor package substrate of an external semiconductor package. The fourth connecting elements 205_1, 205_2 and 205_3 may be attached to the second semiconductor package substrate 201. The fourth connecting elements 205_1, 205_2 and 205_3 may be interposed between an external semiconductor package (for example, the second semiconductor package 200) and the interposer 300.

The fourth connecting elements 205_1, 205_2 and 205_3 may not be configured to transmit an electrical signal between an external semiconductor package and the interposer 300. For example, the fourth connecting elements 205_1, 205_2 and 205_3 may not be configured to transmit an electrical signal between the second semiconductor package 200 and the interposer 300.

The fourth connecting elements 205_1, 205_2, and 205_3 may include, for example, a material capable of transferring the heat of the first semiconductor package 100 to the outside (e.g., a heat transfer material). The fourth connecting elements 205_1, 205_2 and 205_3 may be thermally connected to the second vias 323 through the second pad 313. The first semiconductor chip 110 may be thermally connected to an external semiconductor package (for example, the second semiconductor package 200) through the second vias 323, the second pad 313 and the fourth connecting elements 205_1, 205_2 and 205_3.

Hereinafter, a semiconductor pack according to some exemplary embodiments of the present disclosure will be described with reference to FIG. 11. For clarity of illustration, the redundant description will be omitted.

Figure 11:
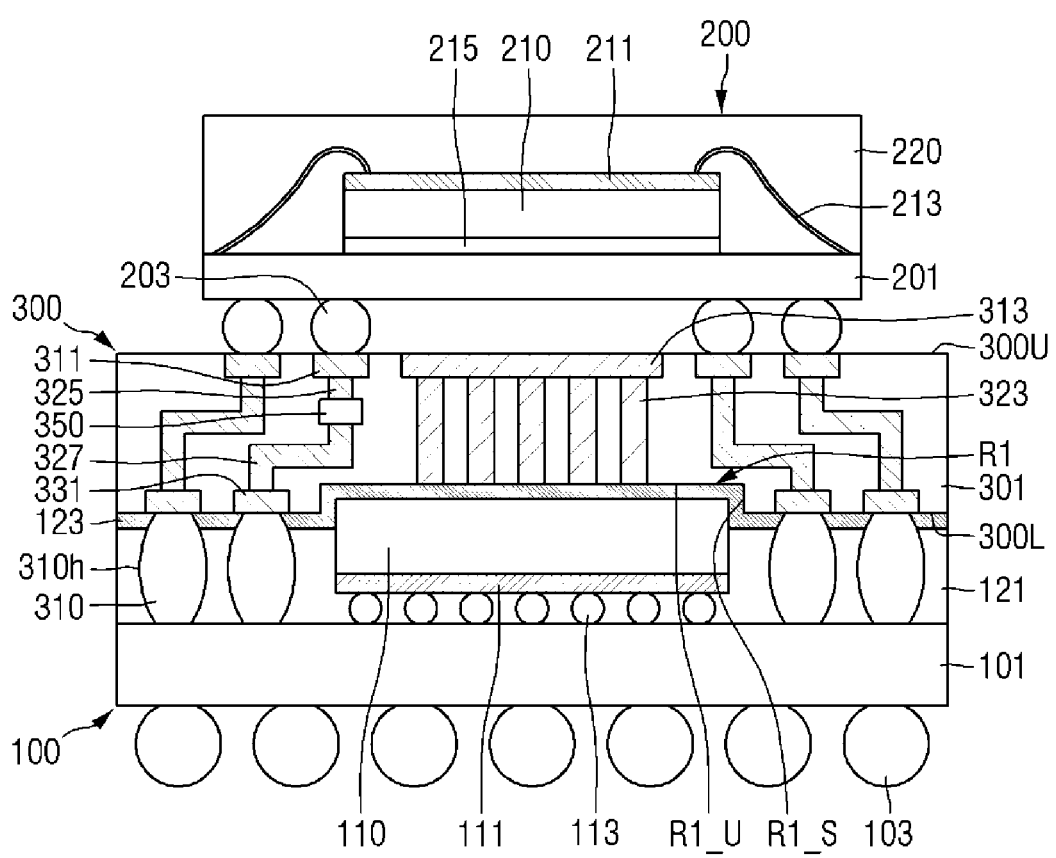

FIG. 11 is a cross-sectional view for illustrating a semiconductor package according to some exemplary embodiments of the present disclosure.

Referring to FIG. 11, the semiconductor package according to some exemplary embodiments of the present disclosure may include a passive element 350 disposed in the interposer 300.

The passive element 350 may be disposed between the first pads 311 and the third pads 331 electrically connected to each other. For example, the first pads 311 may be connected to a third via 325. The third via 325 may be connected to the passive element 350. The passive element 350 may be connected to a fourth via 327. The fourth via 327 may be connected to the third pads 331. The first semiconductor package 100 may transmit/receive electrical signals to/from the second semiconductor package 200 through the interposer connecting elements 310, the third pads 331, the fourth via 327, the passive element 350, the third via 325, and the first pads 311.

In the semiconductor package according to some exemplary embodiments of the present disclosure, the thickness of the interposer 300 can be increased by virtue of the first recess R1, to allow the passive element 350 to be disposed in the interposer 300. For example, let us assume that the overall height of the interposer and the first semiconductor package 100 without the first recess R1 is substantially equal to the overall height of the interposer 300 and the first semiconductor package 100 including the first recess R1. Under the assumption, the thickness of the interposer 300 including the first recess R1 can be larger, or greater, than that of the interposer without the first recess R1 while maintaining the overall height, because at least a portion of the first semiconductor chip 110 may be inserted into the first recess R1.

Hereinafter, a semiconductor package according to some exemplary embodiments of the present disclosure will be described with reference to FIG. 12. For clarity of illustration, the redundant description will be omitted.

Figure 12:
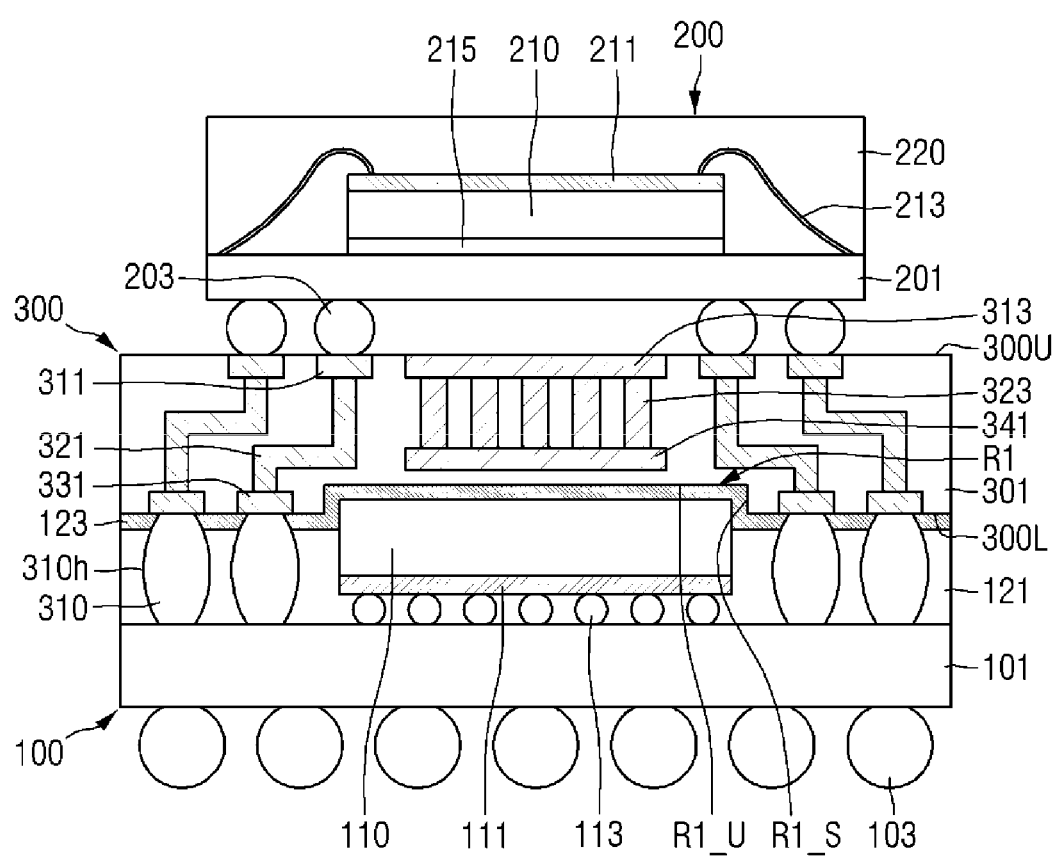

FIG. 12 is a cross-sectional view for illustrating a semiconductor package according to some exemplary embodiments of the present disclosure.

Referring to FIG. 12, in the semiconductor package according to some exemplary embodiments of the present disclosure, a portion of the interposer insulating layer 301 may be disposed between the fourth pad 341 and the upper surface R1_U of the first recess R1. The first recess R1 may expose a portion of the interposer insulating layer 301. The fourth pad 341 may be spaced apart from the first adhesive layer 123.

Hereinafter, a semiconductor pack according to some exemplary embodiments of the present disclosure will be described with reference to FIG. 13. For clarity of illustration, the redundant description will be omitted.

Figure 13:
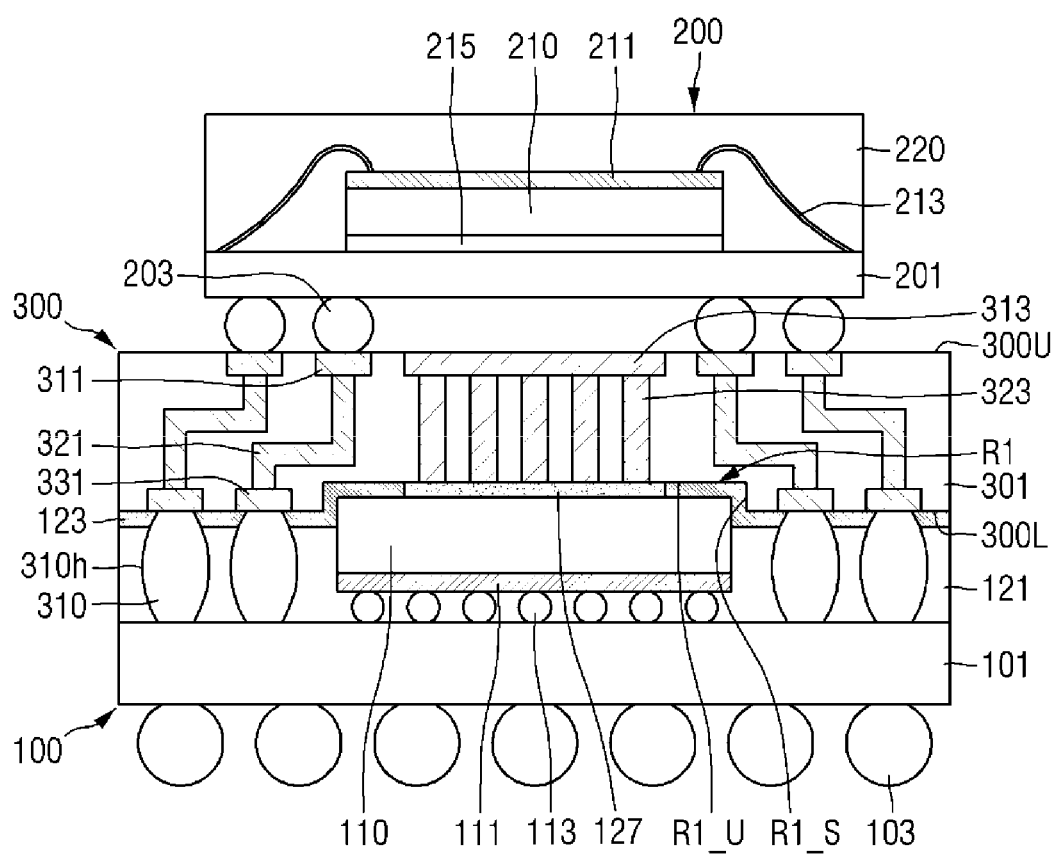

FIG. 13 is a cross-sectional view for illustrating a semiconductor package according to some exemplary embodiments of the present disclosure.

Referring to FIG. 13, the semiconductor package according to some exemplary embodiments of the present disclosure may include a second TIM layer 127 disposed on the first semiconductor chip 110. The second TIM layer 127 may be disposed between the upper surface of the first semiconductor chip 110 and the upper surface R1_U of the first recess R1.

Hereinafter, a semiconductor package according to some exemplary embodiments of the present disclosure will be described with reference to FIGS. 14 and 15. For clarity of illustration, the redundant description will be omitted.

Figure 14:
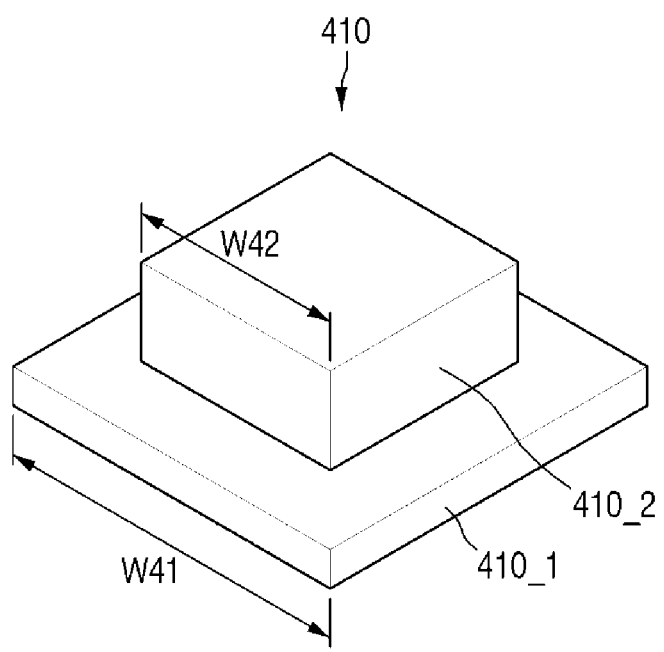
FIG. 14 is a cross-sectional view for illustrating a third semiconductor chip according to some exemplary embodiments of the present disclosure.

FIG. 14 is a cross-sectional view for illustrating a third semiconductor chip 410 according to some exemplary embodiments of the present disclosure. FIG. 15 is a cross-sectional view for illustrating a semiconductor package according to some exemplary embodiments of the present disclosure.

Figure 15:
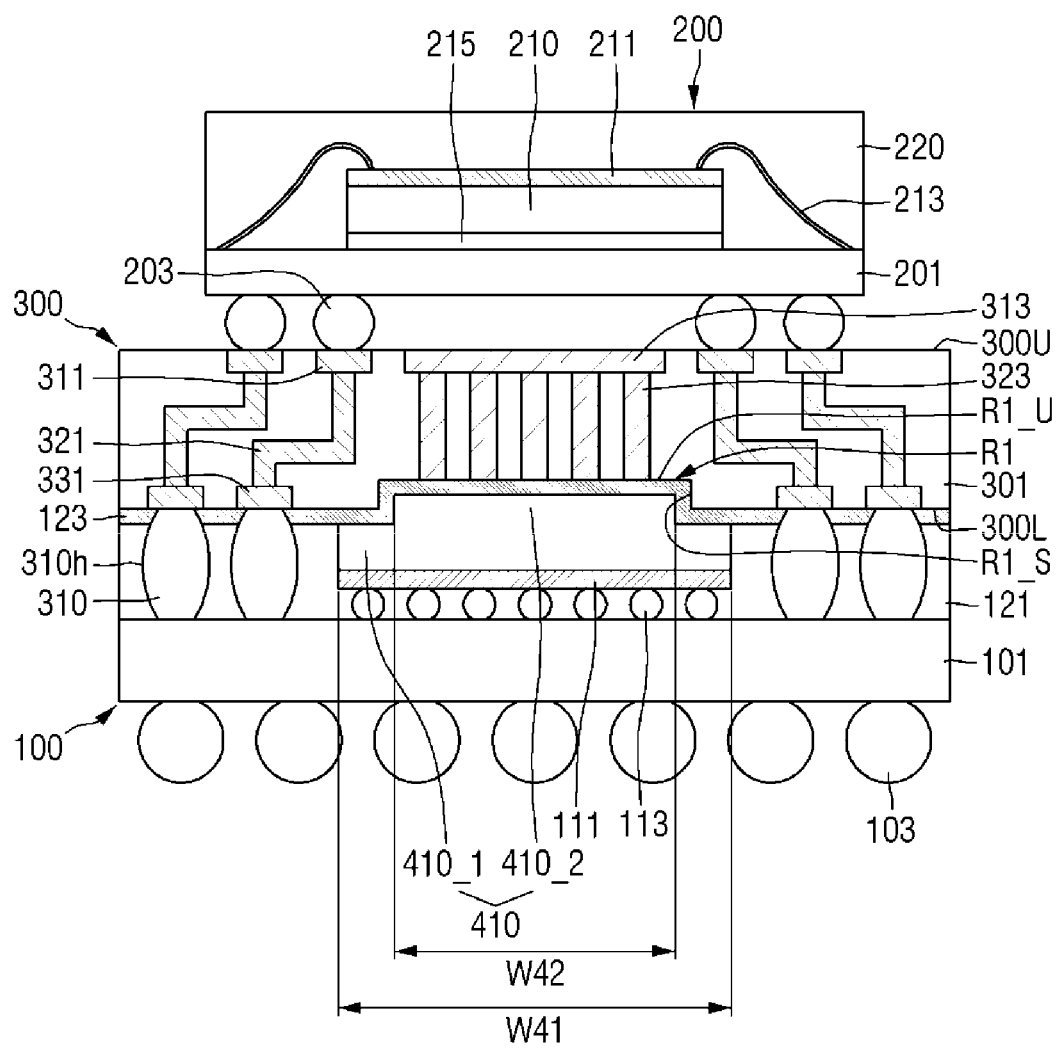
FIGS. 15 to 18 are cross-sectional views for illustrating semiconductor packages according to some exemplary embodiments of the present disclosure.

Referring to FIGS. 14 and 15, the third semiconductor chip 410 according to some exemplary embodiments of the present disclosure may have a shape with a step, for example. The third semiconductor chip 410 may include a first portion 410_1, e.g., first chip portion, and a second portion 410_2, second chip portion.

The second portion 410_2 of the third semiconductor chip 410 may protrude from the first portion 410_1 of the third semiconductor chip 410. The width W41 of the first portion 410_1, e.g., first portion width, of the third semiconductor chip 410 may be larger than the width W42 of the second portion 410_2, e.g., second portion width, of the third semiconductor chip 410. In some embodiments, the first portion 410_1 of the third semiconductor chip 410 may include, for example, the first semiconductor element circuit region 111. The first portion 410_1 and the second portion 410_2 of the third semiconductor chip 410 may be connected to each other.

Although the first portion 410_1 and the second portion 410_2 of the third semiconductor chip 410 are shown as being pieces of the single third semiconductor chip 410, this is merely illustrative. For example, the first portion 410_1 and the second portion 410_2 of the third semiconductor chip 410 may be different semiconductor chips. In such case, the third semiconductor chip 410 may include two different semiconductor chips.

The first portion 410_1 of the third semiconductor chip 410 may be disposed between the second portion 410_2 of the third semiconductor chip 410 and the first semiconductor package substrate 101. At least a part of the second portion 410_2 of the third semiconductor chip 410 may be inserted, for example, into the first recess R1.

In some embodiments, if the second portion 410_2 of the third semiconductor chip 410 is all inserted into the first recess R1, a part of the first portion 410_1 of the third semiconductor chip 410 may be inserted into the first recess R1.

A part of the first portion 410_1 of the third semiconductor chip 410 may be disposed to overlap, i.e., to be overlapping, with at least a part with the second connecting elements 203. A part of the first portion 410_1 of the third semiconductor chip 410 may not overlap with the second portion 410_2 of the third semiconductor chip 410, for example. In addition, the second connecting elements 203, which overlap with at least part of the first portion 410_1 of the third semiconductor chip 410, may be connecting elements disposed closest to the second pad 313. The phrase "an element overlaps with another element" may refer that they overlap with each other, for example, in the vertical direction with respect to the first semiconductor package substrate 101.

Hereinafter, a semiconductor package according to some exemplary embodiments of the present disclosure will be described with reference to FIG. 16. For clarity of illustration, the redundant description will be omitted.

Figure 16:
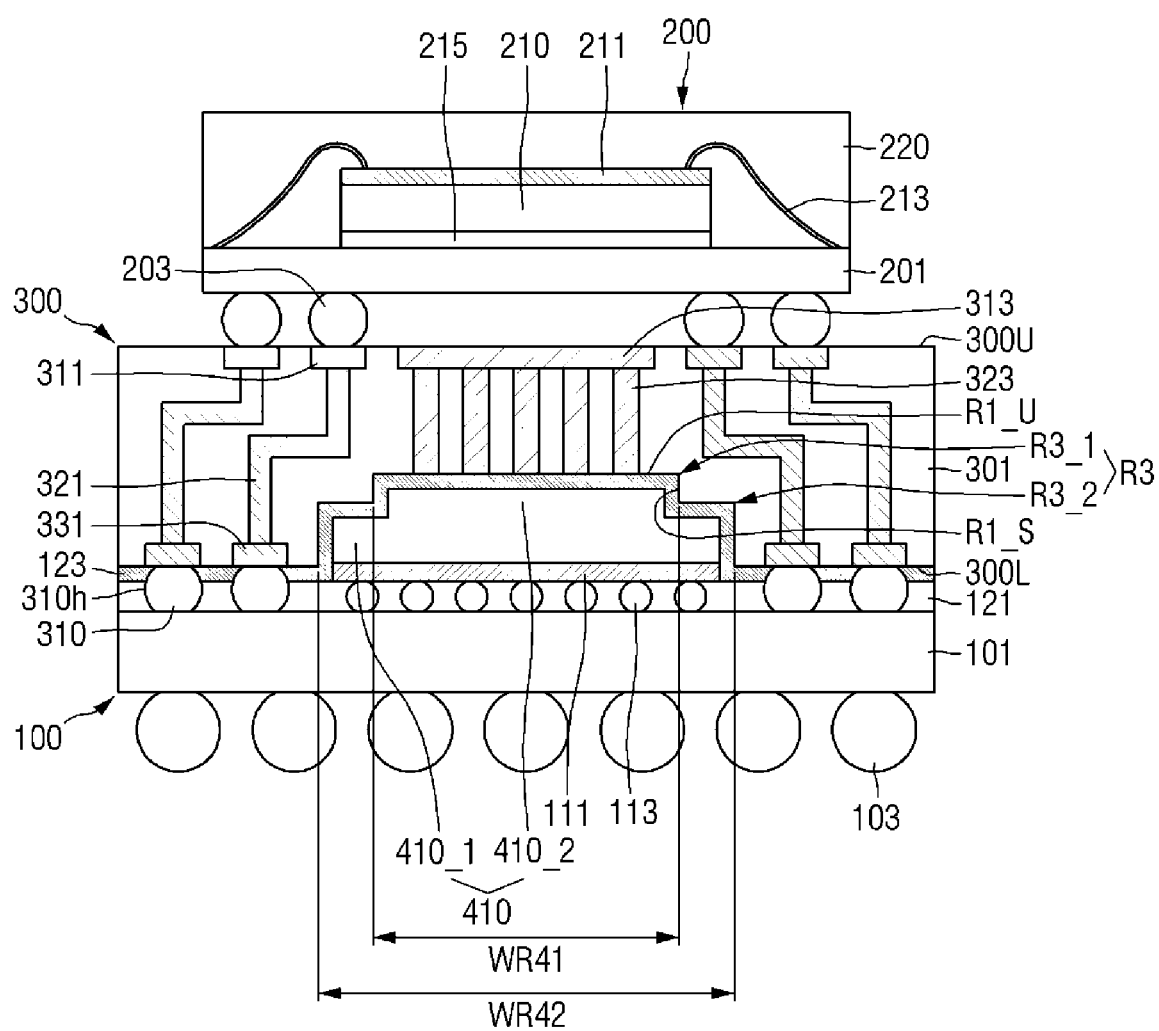

FIG. 16 is a cross-sectional view for illustrating a semiconductor package according to some exemplary embodiments of the present disclosure.

Referring to FIG. 16, the interposer 300 of the semiconductor package according to some exemplary embodiments of the present disclosure may include a third recess R3.

The third recess R3 may include a first portion R3_1, e.g., first recess portion, and a second portion R3_2, e.g., a second recess portion. The first portion R3_1 of the third recess R3 may include an upper surface R3_U of the third recess R3. The first width WR31 of the first portion R3_1, e.g., a first recess width, of the third recess R3 may be smaller than the second width WR32 of the second portion R3_2 of the third recess R3, e.g., a second recess width.

The third semiconductor chip 410 may be completely inserted into the third recess R3. The side walls of the third recess R3 may surround the entire side walls of the third semiconductor chip 410. For example, the second portion 410_2 of the third semiconductor chip 410 may be disposed in the first portion R3_1 of the third recess R3. In addition, the first portion 410_1 of the third semiconductor chip 410 may be disposed in the second portion R3_2 of the third recess R3.

Hereinafter, a semiconductor package according to some exemplary embodiments of the present disclosure will be described with reference to FIG. 17. For clarity of illustration, the redundant description will be omitted.

Figure 17:
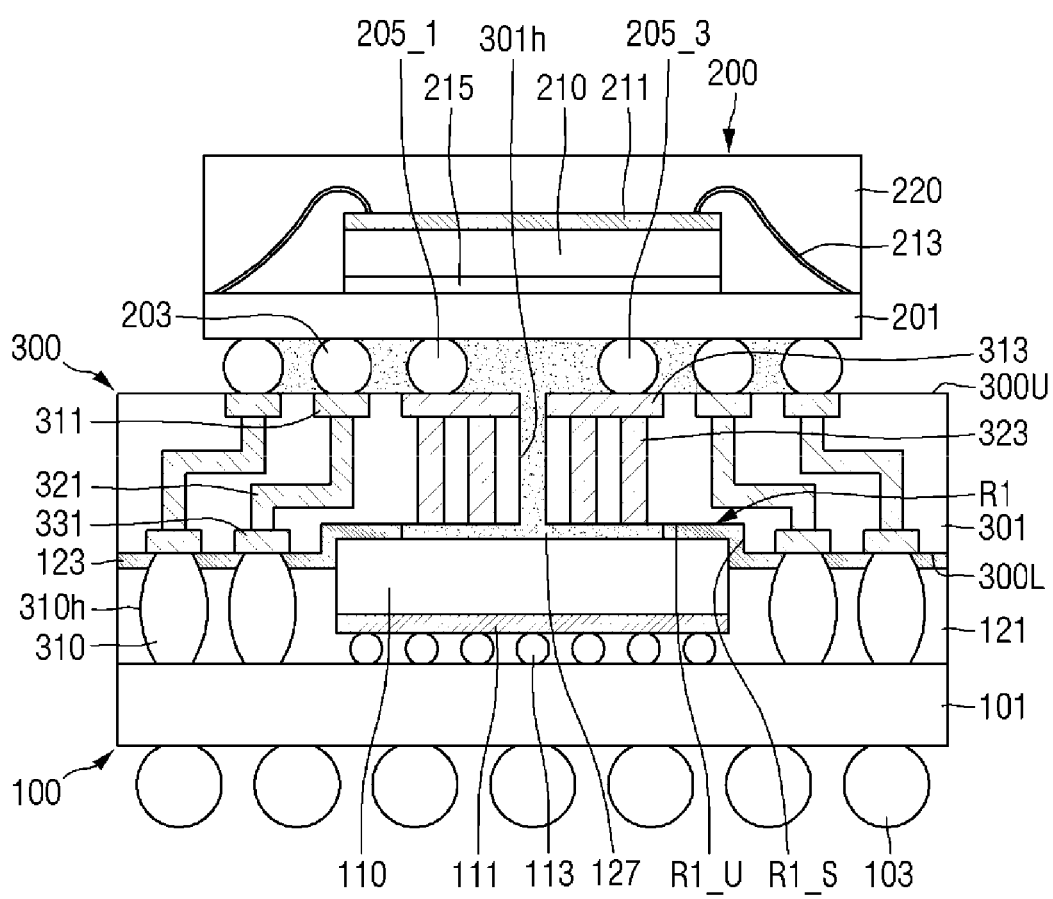

FIG. 17 is a cross-sectional view for illustrating a semiconductor package according to some exemplary embodiments of the present disclosure.

Referring to FIG. 17, the semiconductor package according to some exemplary embodiments of the present disclosure may include an interposer hole 301h and fourth connecting elements 205_1 and 205_3. The second TIM layer 127 may be disposed between the interposer 300 and the first semiconductor chip 110 and is used to fill the interposer hole 301h and the space between the fourth connecting elements 205_1 and 205_3 and the second connecting elements 203.

Hereinafter, a semiconductor package according to some exemplary embodiments of the present disclosure will be described with reference to FIG. 18. For clarity of illustration, the redundant description will be omitted.

Figure 18:
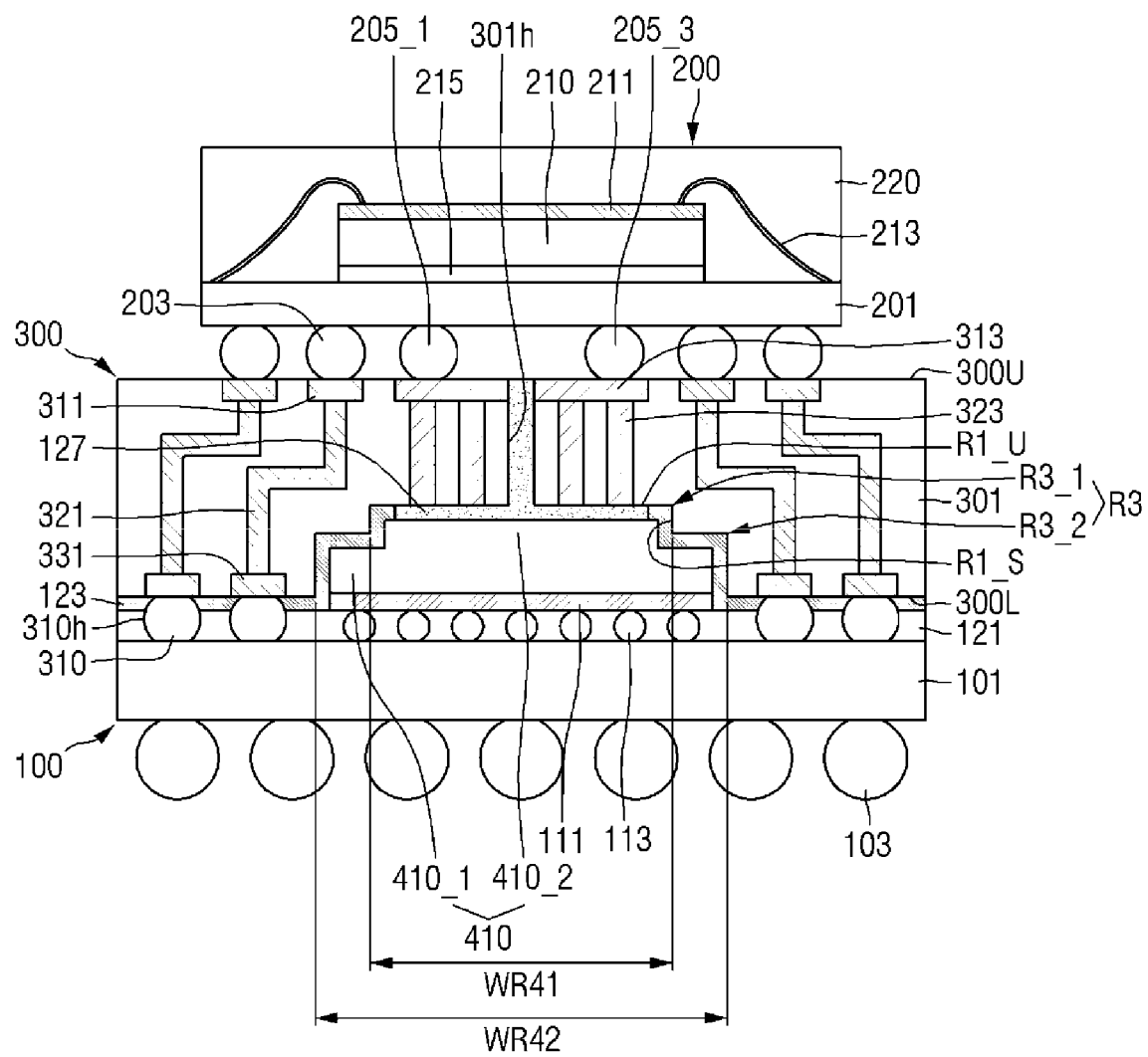

FIG. 18 is a diagram for illustrating a semiconductor package according to some exemplary embodiments of the present disclosure.

Referring to FIG. 18, the semiconductor package according to some embodiments of the present invention may include a third semiconductor chip 410, an interposer hole 301h, and fourth connecting elements 205_1 and 205_3. The second TIM layer 127 may be disposed between the interposer 300 and the third semiconductor chip 410 and may be used to fill the interposer hole 301h at least partially.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims. It is therefore desired that the present embodiments be considered in all respects as illustrative and not restrictive, reference being made to the appended claims rather than the foregoing description to indicate the scope of the invention.

What is claimed is:

1. A semiconductor package comprising:
a first semiconductor package comprising:
a first semiconductor package substrate; and
a first semiconductor chip disposed on the first semiconductor package substrate;
an interposer disposed on the first semiconductor package, wherein the interposer electrically connects the first semiconductor package with a second semiconductor package, the interposer comprising:
a first recess;
a first side; and
a second side opposite to the first side of the interposer, the second side being located between the first side and the first semiconductor package substrate, the first recess being provided in the second side of the interposer, the first recess including:
side walls extending from the second side toward the first side of the interposer; and
an upper surface of the first recess connected to the side walls, the upper surface of the first recess facing the first semiconductor chip;
a via disposed in the interposer, the via extending from the second side toward the first side of the interposer and disposed between the upper surface of the first recess and the first side of the interposer; and
a first connecting element provided on the first side of the interposer to electrically connect the first semiconductor package to the second semiconductor package,
wherein the via is configured to not transmit an electrical signal between the first semiconductor package and the second semiconductor package, and
wherein a gap is provided between the first semiconductor package and the second semiconductor package based on the first connecting element.

2. The semiconductor package of claim 1, wherein at least a part of the first semiconductor chip is disposed in the first recess.

3. The semiconductor package of claim 1, wherein the interposer further comprises an interposer hole penetrating from the recess upper surface to the first side of the interposer.

4. The semiconductor package of claim 3, further comprising: a thermal interface material layer (TIM layer) disposed between the upper surface of the first recess and a first semiconductor chip upper surface, wherein the interposer hole is at least partially filled with the TIM layer.

5. The semiconductor package of claim 1, wherein the interposer further comprises a second recess formed in the upper surface of the first recess, and wherein a first width of the first recess is greater than a second width of the second recess.

6. The semiconductor package of claim 1, wherein the interposer further comprises a first pad disposed on the first side of the interposer, and a second pad disposed in the interposer and the second pad is spaced apart from the first pad and exposed through the first recess, and
wherein the via connects the first pad with the second pad.

7. The semiconductor package of claim 1, further comprising: a thermal interface material layer (TIM layer) disposed between the upper surface of the first recess and an upper surface of the first semiconductor chip.

8. The semiconductor package of claim 1, further comprising: a conductive material layer disposed between an upper surface of the first semiconductor chip and the upper surface of the first recess.

9. The semiconductor package of claim 1, further comprising: a connecting element disposed on the first side of the interposer and overlapping with the via, wherein the connecting element is configured not to transmit an electrical signal between the second semiconductor package and the interposer.

10. The semiconductor package of claim 1, further comprising:
an interposer connecting element disposed on the second side of the interposer and configured to transmit electrical signals between the interposer and the first semiconductor package substrate; and
a first pad disposed on the first side of the interposer and the first pad electrically connects the interposer connecting element with the second semiconductor package.

11. A semiconductor package comprising:
a first semiconductor package comprising:
a first semiconductor package substrate; and
a first semiconductor chip disposed on the first semiconductor package substrate;
an interposer disposed on the first semiconductor package, wherein the interposer electrically connects the first semiconductor package with a second semiconductor package, the interposer comprising:
a first recess;
a first side; and
a second side opposite to the first side, wherein the second side is located between the first side and the first semiconductor package substrate and the first recess is formed in the second side of the interposer, the first recess comprising:
side walls extending from the second side toward the first side of the interposer; and
an upper surface of the first recess connected to the side walls, and the upper surface of the first recess is disposed to face the first semiconductor chip;
an interposer connecting element disposed on the second side of the interposer and configured to transmit electrical signals between the interposer and the first semiconductor package substrate;
a first pad disposed on the first side of the interposer and electrically connecting the interposer connecting element with the second semiconductor package;
a via disposed in the interposer and extending from the second side toward the first side of the interposer, and disposed between the upper surface of the first recess and the first side of the interposer; and
a first connecting element provided on the first side of the interposer to electrically connect the first semiconductor package to the second semiconductor package,
wherein the via is configured to not transmit electrical signals between the first pad and the interposer connecting element, and
wherein a gap is provided between the first semiconductor package and the second semiconductor package based on the first connecting element.

12. The semiconductor package of claim 11, further comprising:

a thermal interface material layer (TIM layer) disposed on the first side of the interposer.

13. The semiconductor package of claim 11, further comprising:
a second pad disposed on the first side of the interposer, spaced apart from the first pad, connected to the via, and configured to not transmit electrical signals between the interposer and the second semiconductor package; and
an interposer insulating layer disposed between the second pad and the upper surface of the first recess,
wherein the first recess exposes the interposer insulating layer.

14. The semiconductor package of claim 11, wherein the first semiconductor chip comprises a first chip portion, and a second chip portion protruding from the first chip portion,
wherein a first width of the first chip portion is greater than a second width of the second chip portion, and
wherein the first chip portion of the first semiconductor chip is disposed in the first recess.

15. The semiconductor package of claim 11, wherein the first recess comprises a first recess portion having a first width and a second recess portion having a second width greater than the first width, and the first recess portion of the first recess comprises the upper surface of the first recess,
wherein the first semiconductor chip comprises a first chip portion, and a second chip portion protruding from the first chip portion,
wherein a first width of the first chip portion of the first semiconductor chip is greater than a second width of the second chip portion of the first semiconductor chip,
wherein the second chip portion of the first semiconductor chip is disposed in the first recess portion of the first recess, and
wherein at least a part of the first chip portion of the first semiconductor chip is disposed in the second recess portion of the first recess.

16. A semiconductor package comprising:
a first semiconductor package comprising:
a first semiconductor package substrate; and
a first semiconductor chip disposed on the first semiconductor package substrate;
a second semiconductor package comprising;
a second semiconductor package substrate; and
a second semiconductor chip disposed on the second semiconductor package substrate;
an interposer interposed between the first semiconductor package and the second semiconductor package and electrically connecting the first semiconductor package and the second semiconductor package, wherein the interposer comprises:
a first side; and
second side opposite to the first side, and the second side being located between the first side and the first semiconductor package substrate;
a first recess formed in the second side of the interposer, wherein the first recess comprises:
side walls extending from the second side toward the first side of the interposer;
an upper surface of the first recess connected to the side walls to face the first semiconductor chip;
a via disposed in the interposer and extending from the second side toward the first side of the interposer and disposed between the upper surface of the first recess and the first side of the interposer; and a first connecting element provided on the first side of the interposer to electrically connect the first semiconductor package to the second semiconductor package, wherein the via is configured to not transmit electrical signals between the first semiconductor package and the second semiconductor package, and wherein a gap is provided between the first semiconductor package and the second semiconductor package based on the first connecting element.

17. The semiconductor package of claim 16, wherein at least a part of the first semiconductor chip is disposed in the first recess.

18. The semiconductor package of claim 16, wherein the interposer further comprises an interposer hole penetrating from the upper surface of the first recess to the first side of the interposer.

19. The semiconductor package of claim 16, wherein the interposer further comprises a second recess formed in the upper surface of the first recess, and wherein a first width of the first recess is greater than a second width of the second recess.

20. The semiconductor package of claim 16, further comprising:

a first connecting element disposed between the second semiconductor package substrate and the interposer, wherein the first connecting element is configured to transmit electrical signals between the second semiconductor package and the interposer.

21. The semiconductor package of claim 20, wherein the first connecting element is electrically disconnected from the via.

22. The semiconductor package of claim 11, wherein the first connecting element is electrically disconnected from the via.

23. The semiconductor package of claim 16, wherein the first connecting element is electrically disconnected from the via.

* * * * *